United States Patent
Bunce et al.

(10) Patent No.: US 9,792,967 B1
(45) Date of Patent: *Oct. 17, 2017

(54) MANAGING SEMICONDUCTOR MEMORY ARRAY LEAKAGE CURRENT

(71) Applicant: International Business Machines Corporation, Armonk, NY (US)

(72) Inventors: Paul A. Bunce, Poughkeepsie, NY (US); Yuen H. Chan, Poughkeepsie, NY (US); John D. Davis, Wallkill, NY (US); Silke Penth, Holzgerlingen (DE); David E. Schmitt, Rochester, MN (US); Tobias Werner, Weil im Schoenbuch (DE); Brian J. Yavoich, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/180,114

(22) Filed: Jun. 13, 2016

(51) Int. Cl.
  *G11C 7/10* (2006.01)
  *G11C 7/12* (2006.01)

(52) U.S. Cl.
  CPC . *G11C 7/12* (2013.01); *G11C 7/10* (2013.01)

(58) Field of Classification Search
  CPC .... G11C 7/06; G11C 7/10; G11C 7/12; G11C 11/40; G11C 11/4063; G11C 11/409; G11C 11/4091
  USPC ...... 365/189.05, 154, 205, 207, 226, 185.21
  See application file for complete search history.

(56) References Cited

U.S. PATENT DOCUMENTS

| 5,274,598 | A | * | 12/1993 | Fujii | G11C 11/4097 365/205 |
| 6,038,193 | A | * | 3/2000 | Wang | G11C 7/06 365/230.03 |
| 6,094,392 | A | * | 7/2000 | Utsugi | G11C 7/06 365/189.11 |
| 6,246,622 | B1 | * | 6/2001 | Sugibayashi | G11C 11/4091 365/168 |
| 6,930,941 | B2 | * | 8/2005 | Nakase | G11C 7/06 365/154 |
| 7,525,844 | B2 | * | 4/2009 | Edahiro | G11C 7/06 365/185.21 |

(Continued)

OTHER PUBLICATIONS

Bunce et al., "Managing Semiconductor Memory Array Leakage Current", U.S. Appl. No. 15/258,056, filed Sep. 7, 2016.

(Continued)

*Primary Examiner* — Tan T. Nguyen
(74) *Attorney, Agent, or Firm* — Nicholas D. Bowman

(57) ABSTRACT

A memory array can include a global evaluation circuit, a local evaluation circuit for evaluating a voltage level of a local bit line and a wake transistor configured to connect an output of the local evaluation circuit to a global bit line (GBL) of the global evaluation circuit. The global evaluation circuit can include a holding circuit. The wake transistor can be turned on in response to a read signal, and remain on while the GBL is precharged to a logical "high" voltage. Memory cells connected to the at least one local bit line can be addressed, and the local bit line can be pulled to a logical "low" voltage for a first time period. The GBL can be pulled to a logical low voltage for a second time period, and the holding circuit polarity can be reversed during a third time period.

14 Claims, 3 Drawing Sheets

(56) References Cited

U.S. PATENT DOCUMENTS

| | | | |
|---|---|---|---|
| 7,697,358 B2* | 4/2010 | Kajigaya | G11O 5/025 |
| | | | 365/205 |
| 8,422,313 B2 | 4/2013 | Buettner et al. | |
| 9,070,433 B1 | 6/2015 | Bunce et al. | |
| 2007/0104002 A1* | 5/2007 | Edahiro | G11C 7/06 |
| | | | 365/203 |
| 2009/0175107 A1 | 7/2009 | Christensen et al. | |
| 2009/0190385 A1 | 7/2009 | Kim | |
| 2009/0251948 A1* | 10/2009 | Kajigaya | G11C 5/147 |
| | | | 365/149 |
| 2010/0054016 A1* | 3/2010 | Kajigaya | G11C 7/067 |
| | | | 365/148 |
| 2010/0054065 A1* | 3/2010 | Kajigaya | G11C 7/067 |
| | | | 365/205 |
| 2010/0135062 A1 | 6/2010 | Kim | |
| 2012/0155188 A1 | 6/2012 | Buettner et al. | |
| 2013/0028032 A1* | 1/2013 | Koike | G11C 7/12 |
| | | | 365/189.15 |
| 2013/0051170 A1* | 2/2013 | Kuroda | G11C 7/062 |
| | | | 365/207 |
| 2013/0148415 A1* | 6/2013 | Shu | G11O 5/063 |
| | | | 365/154 |
| 2013/0176795 A1 | 7/2013 | Dengler et al. | |

OTHER PUBLICATIONS

IBM, List of IBM Patents or Patent Applications Treated as Related, Sep. 5, 2016, 2 pages.

* cited by examiner

US 9,792,967 B1

MANAGING SEMICONDUCTOR MEMORY ARRAY LEAKAGE CURRENT

BACKGROUND

The present disclosure generally relates to memory architecture, and more specifically, to an architecture of a semiconductor memory array.

Semiconductor memory cells may be organized in memory arrays, so that each memory cell is connected to a local bit line and to a word line. At least one local bit line may be evaluated with a local evaluation circuit connected to a global bit line (GBL). The GBL may be used within a relatively high capacity memory array. Drawing the GBL to ground can therefore require a relatively large field-effect transistor (FET). Large FET devices can experience significant leakage currents, which can cause increased chip power consumption relative to smaller FET devices.

SUMMARY

An improved memory array and method for reading such a memory array can have certain advantages in reducing power consumed by the memory array.

Embodiments may be directed towards a method for reading a memory array. The memory array can include a global evaluation circuit having a holding circuit and a local evaluation circuit configured to evaluate a voltage of an at least one local bit line connected to the local evaluation circuit. The memory array can also include a wake transistor electrically coupled to a global bit line (GBL) of the global evaluation circuit and to an output of the local evaluation circuit. The method can include turning on, in response to a read signal, the wake transistor, keeping the wake transistor turned on while precharging the GBL and addressing memory cells connected to the at least one local bit line. The method can also include drawing the at least one local bit line to ground during a first time period, drawing the GBL to ground during a second time period and inverting a polarity of the holding circuit during a third time period.

Embodiments may also be directed towards a memory array. The memory array can include a global evaluation circuit that includes a holding circuit and a local evaluation circuit configured to evaluate the voltage level of at least one local bit line connected to the local evaluation circuit. The memory array can also include a wake transistor configured to electrically couple an output of the local evaluation circuit to GBL of the global evaluation circuit. The memory array can be configured to turn on, in response to a read signal, the wake transistor and keep the wake transistor turned on while precharging the GBL to a logical "high" level. The memory array can also be configured to address memory cells connected to the at least one local bit line, draw the at least one local bit line to ground during a first time period, draw the GBL to ground during a second time period and invert the polarity of the holding circuit during a third time period.

Embodiments may also be directed towards a memory array. The memory array can include a global evaluation circuit that includes a holding circuit and a local evaluation circuit configured to evaluate the voltage level of at least one local bit line connected to the local evaluation circuit. The memory array can also include a wake transistor electrically coupled to an output of the local evaluation circuit and to a GBL of the global evaluation circuit and a wake circuit configured to generate a wake signal to turn on, in response to a read signal, the wake transistor.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
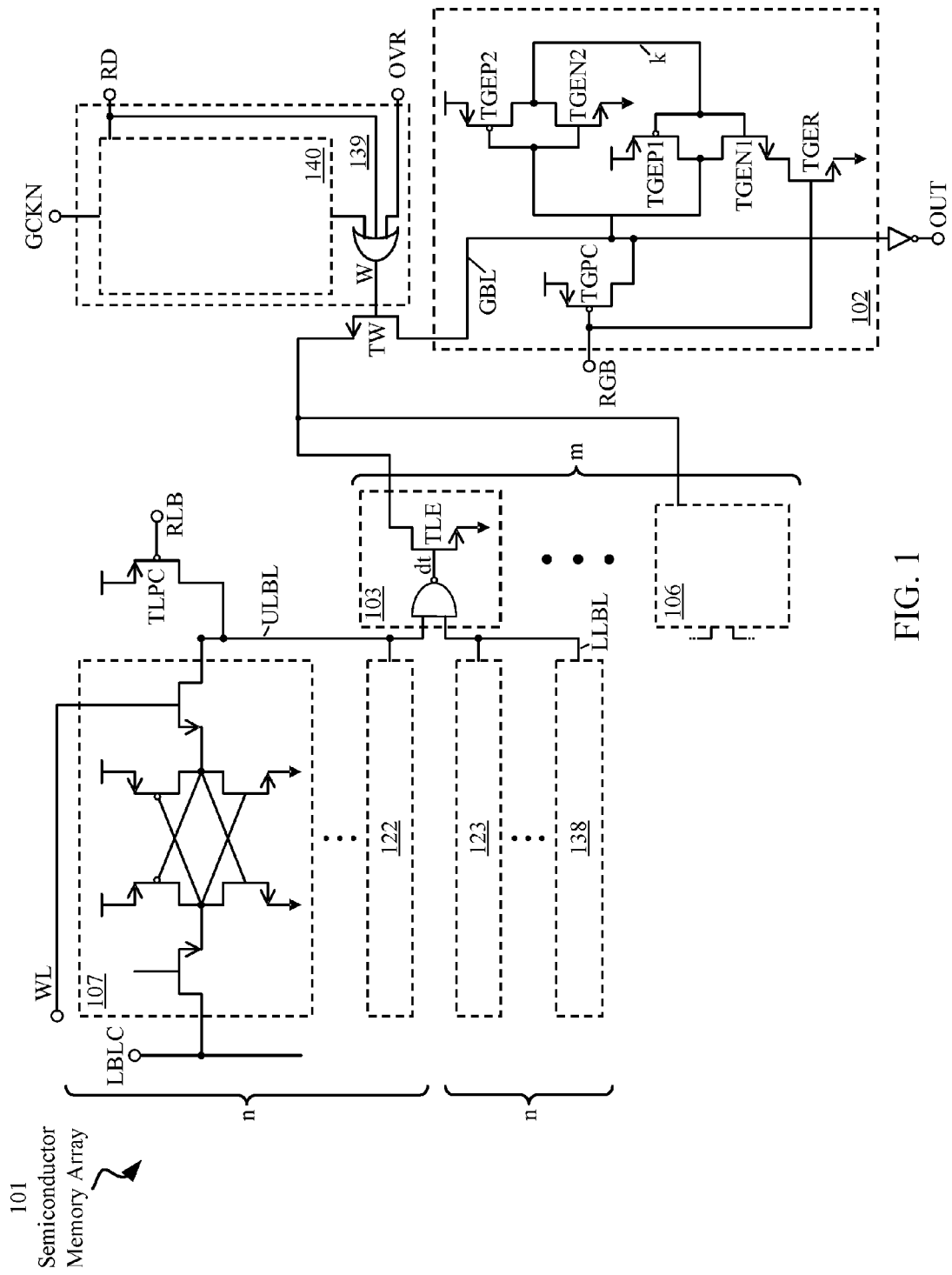
FIG. 1 depicts a semiconductor memory array.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

In the drawings and the Detailed Description, like numbers generally refer to like components, parts, steps, and processes.

DETAILED DESCRIPTION

The present disclosure may be better understood, and its numerous objects, features, and advantages made apparent to those skilled in the art by referencing the accompanying drawings. FIG. 1 depicts a semiconductor memory array 101 that includes a global evaluation circuit 102, at least one local evaluation circuit 103, memory cells 107-138, wake circuit 139 including a staging latch 140, and wake transistor TW. In some embodiments, semiconductor memory array 101 includes a plurality of local evaluation circuits, e.g., 103-106, as depicted in FIG. 1.

According to embodiments, an upper local bit line, e.g., ULBL, and a lower local bit line, e.g., LLBL are connected to each local evaluation circuit 103-106. A number "n" of memory cells, e.g., 107-122 and 123-138, are each connected, through an upper local bit line ULBL and a lower local bit line LLBL, respectively, to each local evaluation circuit, e.g., 103. For example, in some embodiments, the number "n" can be 16, such that 16 memory cells 107-122 are connected to the upper local bit line ULBL and 16 memory cells 123-138 are connected to the lower local bit line LLBL. The memory cells, e.g., 107-122, may be static random-access memory (SRAM) memory cells. In particular, the SRAM cells may be six transistor (6T) SRAM cells, as depicted in memory cell 107.

According to embodiments, a wake transistor TW is electrically connected to an output of the local evaluation circuit 103 and to a global bit line (GBL) of the global evaluation circuit 102. A number "m" of local evaluation circuits 103-106 are connected to the GBL in the depicted embodiment. In some embodiments, for example, the number "m" of local evaluation circuits connected to the GBL may be four.

In embodiments, the local evaluation circuit 103 includes an inverting CMOS gate, e.g., a NAND gate or a NOR gate, and the transistor TLE is designed to rapidly pull down the GBL to ground in response to the output of the inverting CMOS gate. According to embodiments, the inputs of the inverting CMOS gate are connected to at least one of the local bit lines, e.g., ULBL and LLBL. Local evaluation circuit 103 can be useful for evaluating the voltage level of at least one local bit line, e.g., ULBL and/or LLBL, connected to the local evaluation circuit 103.

Due to the large capacitance generally associated with the GBL, a comparably large transistor, e.g., FET, TLE may be used to ensure that the GBL can be rapidly pulled to ground. The leakage currents of a FET device are generally proportional to the FET's size or width. In order to reduce the leakage currents, a wake transistor TW is connected in series with the TLE transistor, the wake transistor TW only connecting the global evaluation circuit 102 to the GBL when the content of the memory cells, e.g., 107-138, are to be read.

In the case where the memory cells 107-138 are not to be read, the semiconductor memory array 101 can be put into a "sleep" mode, where the wake transistor TW is turned off. The use of the two stacked NFETs TW and TLE can considerably reduce the leakage current from the global evaluation circuit 102 to ground, relative to the leakage current resulting from the use of the single FET device TLE. Thus, the power consumption of the semiconductor memory array 101 can be reduced significantly.

In embodiments, the semiconductor memory array 101 includes a global evaluation circuit 102 useful for evaluating the voltage level of the GBL. According to embodiments, the global evaluation circuit 102 includes a holding circuit, for example, a latch composed of the four transistors TGEP1, TGEN1, TGEP2 and TGEN2. The holding circuit can be used to keep the GBL at the voltage level corresponding to the value stored in the addressed memory cells, e.g., 107-122. In some embodiments the global evaluation circuit 102 includes a feedback control transistor TGER which, in response to a restore GBL signal RGB, controls the latch feedback provided by transistor TGEN1. The global evaluation circuit 102 can also include a GBL precharging transistor TGPC which can be useful for precharging the GBL in response to a restore GBL signal RGB.

The wake circuit 139 can be useful for generating a wake signal W for turning on the wake transistor TW, causing it to be conductive in response to a read signal RD. Use of the wake signal W in conjunction with wake transistor TW can lead to reduced power consumption of a semiconductor memory array 101. In some embodiments, the wake circuit 139 can also include a staging latch 140 that can be useful for determining the duration of the wake signal W. In some embodiments, the wake circuit 139 includes an OR gate. The first input of the OR gate can be connected to receive the read signal RD, and the second input of the OR gate can be connected to receive an output of the staging latch 140. In some embodiments, a third input of the OR gate can be connected to receive an override signal OVR. The override signal OVR can be used to continuously turn on the wake transistor TW, causing it to be conductive. The output of the OR gate is connected to the gate input of the wake transistor TW.

In some embodiments, the semiconductor memory array 101 is configured to keep the wake transistor TW turned on, i.e., conductive, for more than one memory cycle time. In some embodiments, the semiconductor memory array 101 is configured to reset the latch while precharging the GBL. The semiconductor memory array 101 can also be configured to precharge the at least one local bit line, e.g., ULBL or LLBL, connected to the local evaluation circuit 103, to a logical "high" voltage before precharging the GBL to a logical "high" voltage. In some embodiments, a logical high voltage of the at least one local bit line may be the same as a logical high voltage of the GBL. In some embodiments, a logical high voltage of the at least one local bit line may be different than a logical high voltage of the GBL. According to embodiments, the semiconductor memory array 101 can also be configured to keep the wake transistor TW conductive in response to the read signal RD and a global clock signal GCKN.

A method for reading semiconductor memory array 101 can include turning on, in response to a read signal RD, the wake transistor TW, causing it to be conductive and keeping the wake transistor TW turned on while precharging the GBL to a logical high voltage. According to embodiments, the memory cells, e.g., at least one of memory cells 107-138, connected to the at least one local bit line ULBL, can then be addressed. The method can also include waiting a first time period required for pulling down the at least one of the local bit lines ULBL or LLBL, waiting a second time period required for pulling down the GBL, and waiting a third time period required for inverting the polarity of the holding circuit, e.g., the latch composed of the four transistors TGEP1, TGEN1, TGEP2 and TGEN2 (FIG. 1). Benefits of the application of the above-described method may include reduced power consumption of the semiconductor memory array 101.

In some embodiments, the method can also include keeping the wake transistor TW conductive for more than one memory cycle time, which can ensure that the wake transistor TW remains conductive during the time necessary for inverting the polarity of the holding circuit. In some embodiments, precharging the GBL can also include resetting the holding circuit, which can be useful in avoiding contention between the holding circuit and the precharging of the GBL. In some embodiments, the method can also include precharging the at least one local bit line, e.g., ULBL or LLBL, connected to the local evaluation circuit 103 to a logical high voltage before precharging the GBL to a logical high voltage. Embodiments of the method can be useful to keep the wake transistor TW conductive in response to the read signal RD and the global clock signal GCKN.

For reading, for example, the content of one of the memory cells 107-122, in a first operation, the voltage level of the GBL and the voltage level of the upper local bit line ULBL can be raised to $V_{DD}$. The memory cell to be read can then be addressed through the respective word line WL. Depending on the content of the memory cell, the upper local bit line ULBL can remain at approximately $V_{DD}$ or can be pulled to ground. In case the upper local bit line ULBL is pulled to ground, the output of the NAND gate of the local evaluation circuit 103 becomes logical high voltage and turns on the n-channel field-effect transistor (NFET) TLE. Accordingly, the activated transistor TLE pulls the GBL to ground. The logical high voltage of the GBL is maintained by the latch formed by transistors TGEP1, TGEN1, TGEP2 and TGEN2, for further processing. Disconnecting the GBL from the local evaluation circuit 103 output by turning off wake transistor TW after a read command may reduce the leakage current and thus the power necessary for keeping the GBL at a logical high level.

Figure 2:
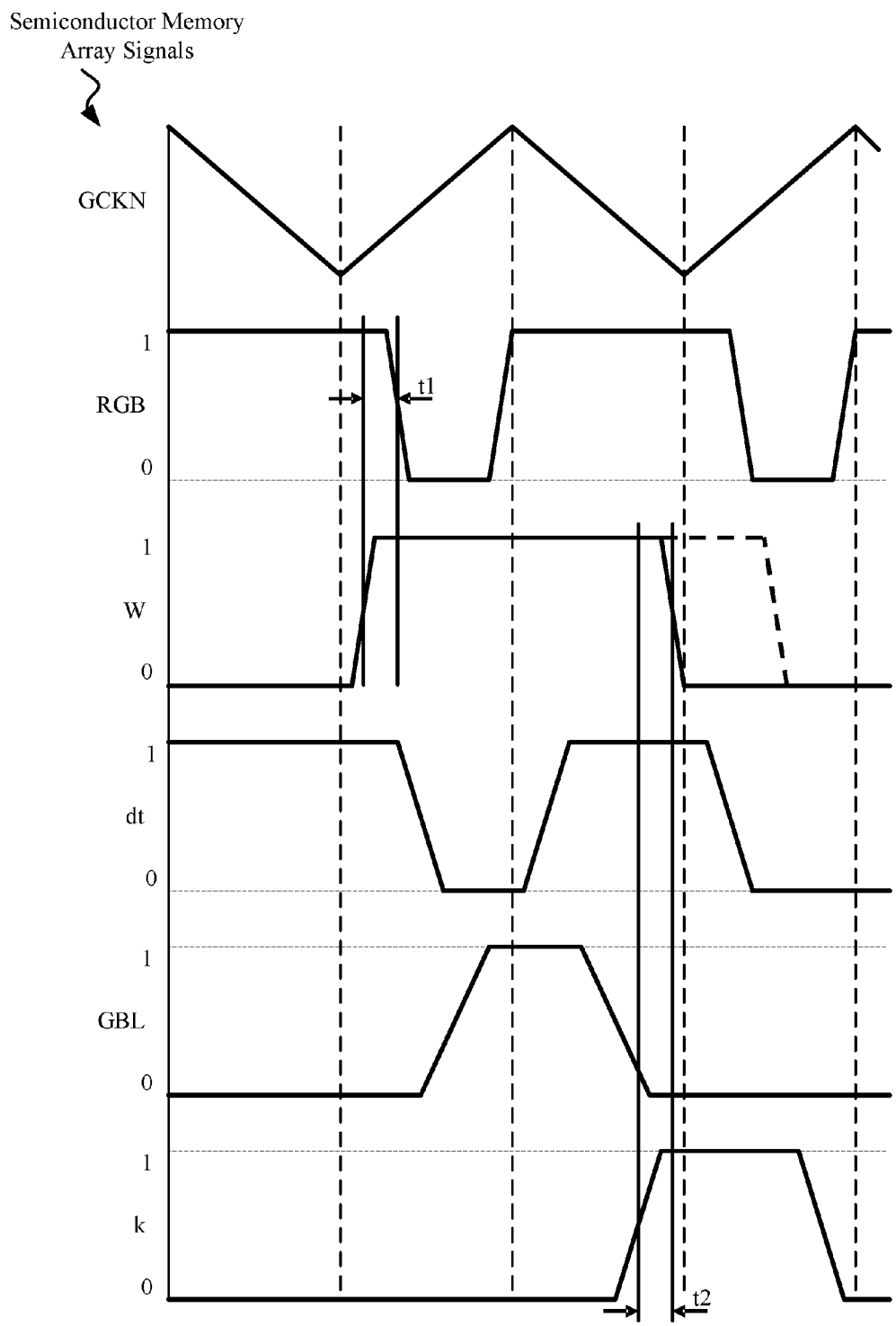
FIG. 2 depicts example semiconductor memory array signals over time.

FIG. 2 depicts simplified example semiconductor memory array signal variations over time. In particular, FIG. 2 depicts the behavior of the voltage level of the inverted global clock GCKN, the reset GBL signal RGB, the wake signal W, the output dt of the NAND gate of the local evaluation circuit 103, the GBL, and the inverted branch k of the latch of the global evaluation circuit 102.

A read signal RD (see FIG. 1) triggers the wake signal W to transition to a logical high voltage and to turn on the transistor TW, causing it to become conductive. After a short time t1 the restore GBL signal RGB (and the restore local bit line signal RLB, not shown in FIG. 2) transitions to a ground level. Accordingly, the local bit lines ULBL, LLBL and the GBL are raised to $V_{DD}$ (if not already at $V_{DD}$) and the output dt of the NAND gate of the local evaluation circuit 103 is pulled to ground. Hence, the transistor TLE is turned off, causing it to become non-conducting. The shallower edge of the GBL signal GBL in comparison to the signal W and dt can result from a relatively high capacitance of the GBL. In case the memory cell 102 stores a logic "1" and is addressed via the word line WL after the local bit line ULBL has been precharged to $V_{DD}$, the memory cell 102 will pull down the ULBL. Accordingly, dt will become high and cause the transistor TLE to become conductive. Thus, the GBL will be pulled to ground and the inverted branch k of the output latch will invert or "flip". The wake signal W is high during the entire process. Only after the inverted branch k of the latch of the global evaluation circuit 102 has switched, the wake signal W will transition to ground again. The wake signal W will remain high until the inverted branch k of the latch of the global evaluation circuit 102 has switched, in particular, if it is allowed to transition to ground only in the next global clock cycle as indicated with dashed lines. To this end, the semiconductor memory array 101 may include a holding latch 140 triggered by the read signal RD and the global clock signal GCKN.

If the read signal RD is high the OR gate of the wake circuit 139 will output a high signal. If the read signal RD transitions to ground level again, the holding latch 140 will hold the high signal until the next impulse of the global clock GCKN after the read signal RD. Thus, the wake signal W remains high during a subsequent memory cycle.

Figure 3:
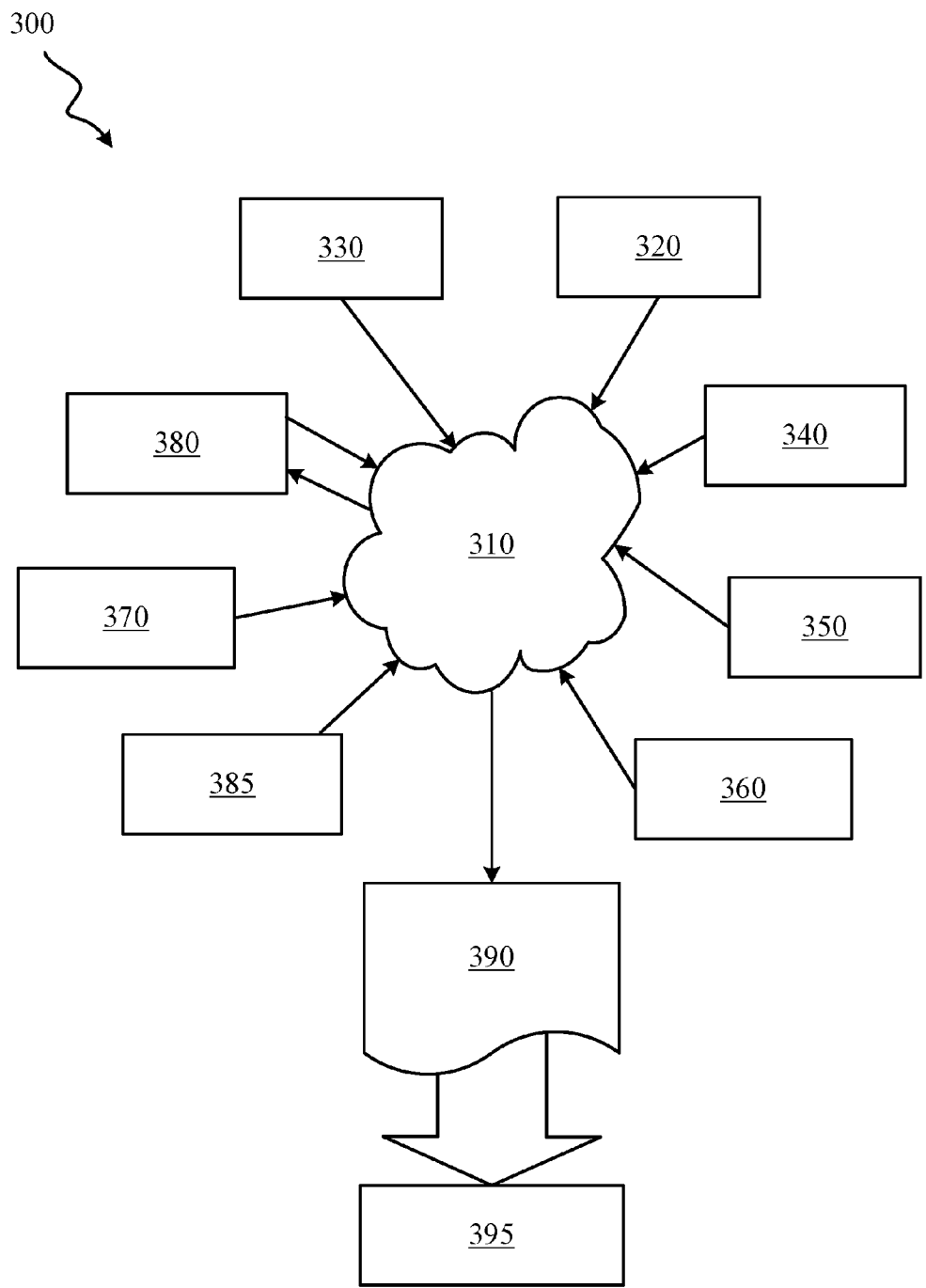
FIG. 3 is a diagram depicting a design process used in semiconductor design, manufacture, and/or test of the inventive memory array depicted in, according to embodiments of the disclosure.

FIG. 3 illustrates multiple design structures 300 including an input design structure 320 that is preferably processed by a design process. Design structure 320 may be a logical simulation design structure generated and processed by design process 310 to produce a logically equivalent functional representation of a hardware device. Design structure 320 may alternatively include data or program instructions that, when processed by design process 310, generate a functional representation of the physical structure of a hardware device. Whether representing functional or structural design features, design structure 320 may be generated using electronic computer-aided design, such as that implemented by a core developer/designer. When encoded on a machine-readable data transmission, gate array, or storage medium, design structure 320 may be accessed and processed by at least one hardware or software modules within design process 310 to simulate or otherwise functionally represent an electronic component, circuit, electronic or logic module, apparatus, device, or system such as those shown in FIG. 1. As such, design structure 320 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 310 preferably employs and incorporates hardware or software modules for synthesizing, translating, or otherwise processing a design/simulation functional equivalent of the components, circuits, devices, or logic structures shown in FIG. 1 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describe the connections to other elements and circuits in an integrated circuit design. Netlist 380 may be synthesized using an iterative process in which Netlist 380 is resynthesized at least one times depending on design specifications and parameters for the device. As with other design structure types described herein, Netlist 380 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310, without deviating from the scope and spirit of the disclosure. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures, along with any additional mechanical design or data, to generate a second design structure 390. Design structure 390 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 320, design structure 390 preferably comprises at least one files, data structures, or other computer-encoded data or instructions that reside on transmission or data storage media and that, when processed by an ECAD system, generate a logically or otherwise functionally equivalent form of at least one of the embodiments of the disclosure shown in FIG. 1. In one embodiment, design structure 390 may comprise a compiled, executable HDL simulation model that functionally simulates the devices shown in FIG. 1.

Design structure 390 may also employ a data format used for the exchange of layout data of integrated circuits and/or symbolic data format (e.g., information stored in a GDSII, GL1, OASIS, map files, or any other suitable format for storing such design data structures). Design structure 390 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 390 may then proceed to a state 395 where, for example, design structure 390 proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A memory array comprising:
   a global evaluation circuit that includes a holding circuit;
   a local evaluation circuit configured to evaluate the voltage level of at least one local bit line connected to the local evaluation circuit; and
   a wake transistor configured to electrically couple an output of the local evaluation circuit to a global bit line (GBL) of the global evaluation circuit;
   wherein the memory array is configured to:
      turn on, in response to a read signal, the wake transistor;
      keep the wake transistor turned on while precharging the GBL to a logical "high" level;
      address memory cells connected to the at least one local bit line;
      draw the at least one local bit line to ground during a first time period;
      draw the GBL to ground during a second time period; and
      invert the polarity of the holding circuit during a third time period.

2. The memory array of claim 1, wherein the holding circuit is a latch.

3. The memory array of claim 1, wherein the memory array is configured to keep the wake transistor conductive for more than one memory cycle time.

4. The memory array of claim 1, wherein the memory array is configured to reset the holding circuit while precharging the GBL.

5. The memory array of claim 1, wherein the memory array is configured to precharge the at least one local bit line to a first logical high voltage before precharging the GBL to a second logical high voltage.

6. The memory array of claim 1, wherein the memory array is configured to keep the wake transistor turned on in response to the read signal and a global clock signal.

7. A memory array comprising:
   a global evaluation circuit that includes a holding circuit,
   a local evaluation circuit configured to evaluate the voltage level of at least one local bit line connected to the local evaluation circuit;
   a wake transistor electrically coupled to an output of the local evaluation circuit and to a global bit line (GBL) of the global evaluation circuit; and
   a wake circuit configured to generate a wake signal to turn on, in response to a read signal, the wake transistor.

8. The memory array of claim 7, wherein the holding circuit is a latch.

9. The memory array of claim 7, wherein the wake circuit includes a staging latch configured to determine a duration of the wake signal.

10. The memory array of claim 7, wherein the wake circuit includes an OR gate, a first input of the OR gate connected to receive the read signal, a second input of the OR gate connected to receive an output of the staging latch and an output of the OR gate connected to a gate input of the wake transistor.

11. The memory array of claim 10, wherein a third input of the OR gate is connected to receive an override signal to keep the wake transistor turned on.

12. The memory array of claim 7, wherein the global evaluation circuit includes a transistor configured to, in response to a restore GBL signal, reset the holding circuit.

13. The memory array of claim 7, wherein the global evaluation circuit includes a transistor configured to, in response to a restore GBL signal, precharge the GBL.

14. The memory array of claim 7, wherein the local evaluation circuit includes an inverting complementary metal-oxide semiconductor (CMOS) gate and a transistor, the transistor configured to draw, in response to the output of the inverting CMOS gate, the GBL to ground, an at least one input of the inverting CMOS gate being connected to the at least one local bit line.

* * * * *